United States Patent
Wu et al.

(10) Patent No.: US 9,214,949 B1
(45) Date of Patent: Dec. 15, 2015

(54) ANALOG TO DIGITAL CONVERTER HAVING SWITCHED CAPACITOR POWER SUPPLY

(71) Applicant: BROADCOM CORPORATION, Irvine, CA (US)

(72) Inventors: Jiangfeng Wu, Irvine, CA (US); Tianwei Li, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/583,907

(22) Filed: Dec. 29, 2014

Related U.S. Application Data

(60) Provisional application No. 62/089,068, filed on Dec. 8, 2014.

(51) Int. Cl.
*H03M 1/34* (2006.01)
*H03M 1/00* (2006.01)
*H03M 1/12* (2006.01)

(52) U.S. Cl.
CPC ............. *H03M 1/002* (2013.01); *H03M 1/129* (2013.01); *H03M 1/34* (2013.01)

(58) Field of Classification Search
CPC ........ H03M 1/002; H03M 1/34; H03M 1/129
USPC .................................................. 341/158, 155
See application file for complete search history.

(56) References Cited

U.S. PATENT DOCUMENTS

| | | | | |
|---|---|---|---|---|
| 7,382,302 B2 * | 6/2008 | Muramatsu et al. | .......... | 341/155 |
| 7,659,845 B2 * | 2/2010 | Bresch | .......... | 341/172 |
| 8,593,319 B2 * | 11/2013 | Kwon et al. | .......... | 341/143 |
| 8,730,078 B2 * | 5/2014 | Lin | .......... | 341/158 |

* cited by examiner

*Primary Examiner* — Khai M Nguyen
(74) *Attorney, Agent, or Firm* — Garlick & Markison; Bruce E. Garlick

(57) ABSTRACT

An Analog to Digital Converter (ADC) includes an ADC core, a first switched capacitor voltage regulator, and a second switched capacitor voltage regulator. The ADC core includes a plurality of digital components that sample an incoming signal based on an ADC clock, a first voltage, and a first ground and a plurality of analog components configured to operate using a second voltage and a second ground. The first switched capacitor voltage regulator produces the first voltage and the first ground for the plurality of digital components using a supply voltage, a supply ground, and the ADC clock. The second switched capacitor voltage regulator produces the second voltage and the second ground using the supply voltage, the supply ground, and the ADC clock. Switching of the first and second switched capacitor voltage regulators is performed using complementary and non-overlapping clocks having switching frequency that is based upon the ADC clock.

20 Claims, 9 Drawing Sheets

FIG. 8

802 — GENERATE FIRST VOLTAGE AND FIRST GROUND USING FIRST SWITCHED CAPACITOR VOLTAGE REGULATOR THAT USES A SUPPLY VOLTAGE, SUPPLY GROUND, AND AN ADC CLOCK

804 — GENERATE SECOND VOLTAGE AND SECOND GROUND USING SECOND SWITCHED CAPACITOR VOLTAGE REGULATOR THAT USES THE SUPPLY VOLTAGE, THE SUPPLY GROUND, AND THE ADC CLOCK

806 — SAMPLE AT LEAST ONE INCOMING ANALOG SIGNAL USING A PLURALITY OF DIGITAL COMPONENTS THAT OPERATE USING THE ADC CLOCK, THE FIRST VOLTAGE AND THE FIRST GROUND

808 — OPERATE ON AT LEAST THE INCOMING ANALOG SIGNAL USING A PLURALITY OF ANALOG COMPONENTS THAT USE THE SECOND VOLTAGE AND THE SECOND GROUND

800

ANALOG TO DIGITAL CONVERTER HAVING SWITCHED CAPACITOR POWER SUPPLY

CROSS REFERENCE TO RELATED PATENTS/PATENT APPLICATIONS

The present U.S. Utility Patent Application claims priority pursuant to 35 U.S.C. §119(e) to U.S. Provisional Application No. 62/089,068, entitled "ANALOG TO DIGITAL CONVERTER HAVING SWITCHED CAPACITOR POWER SUPPLY", filed Dec. 8, 2014, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND

1. Technical Field

This disclosure relates generally to communications devices and more particularly to signal conversion circuitry in a communication device.

2. Description of Related Art

Communication systems are well known and include wireless networks, wired networks, and various other types of networks. Wired networks use wiring or fiber to direct communications between communication devices while wireless networks support communications wirelessly. Examples of wired networks are optical networks, the telephone network, Local Area Networks (LANs), Wide Area Networks (WANs), and cable networks, etc. Examples of wireless networks include satellite networks, cellular networks, microwave networks, Wireless Local Area Networks (WLANs), Wireless Personal Area Networks (WPANs), and point to point Radio Frequency networks, etc.

As communications technology has advanced, integrated circuits have been developed that service both wired and wireless communications. Most communication devices, such as cellular telephones, digital modems, set top boxes, lap top computers, tablet computers, desk top computers, printers, and other communication devices include multiple integrated circuits. Integrated circuits that service communications typically include multiple Analog to Digital Converters (ADCs) and multiple Digital to Analog Converters (DACs). ADCs convert signals from analog format to digital format and DACs convert signals from digital format to analog format.

ADCs often must sample signals having voltage magnitudes and information signal bandwidths that vary over time. In order to compensate for these differing signals, ADCs operate at differing sampling frequencies and at differing sampling voltage ranges to satisfy their varying operational requirements. Supply voltages used to power integrated circuits that include the ADCs are typically constant over time. Thus, prior devices used linear regulator to provide the ADCs with voltages that differed from the supply voltage to enable wider sampling ranges. Using linear regulators to generate the ADC voltages increased ADC power consumption. Further, some desirable voltage levels could not be generated by the linear regulators, e.g., ADC voltages above the supply voltage and ADC grounds below the supply ground.

Other prior devices used switching regulators to generate the ADC voltages. However, using switching regulators increased I/O pin count, increased cost due to increased part count, and introduced power supply spurs that degrade performance. Further, external regulators were not optimized for required ADC characteristics such as sampling frequency, sampling bandwidth, and sampling signal range.

BRIEF DESCRIPTION OF THE SEVERAL VIEWS OF THE DRAWING(S)

FIG. 8 is a flow chart illustrating operation of an analog to digital converter according to one or more embodiments of the present disclosure.

DETAILED DESCRIPTION OF THE DISCLOSURE

Figure 1:
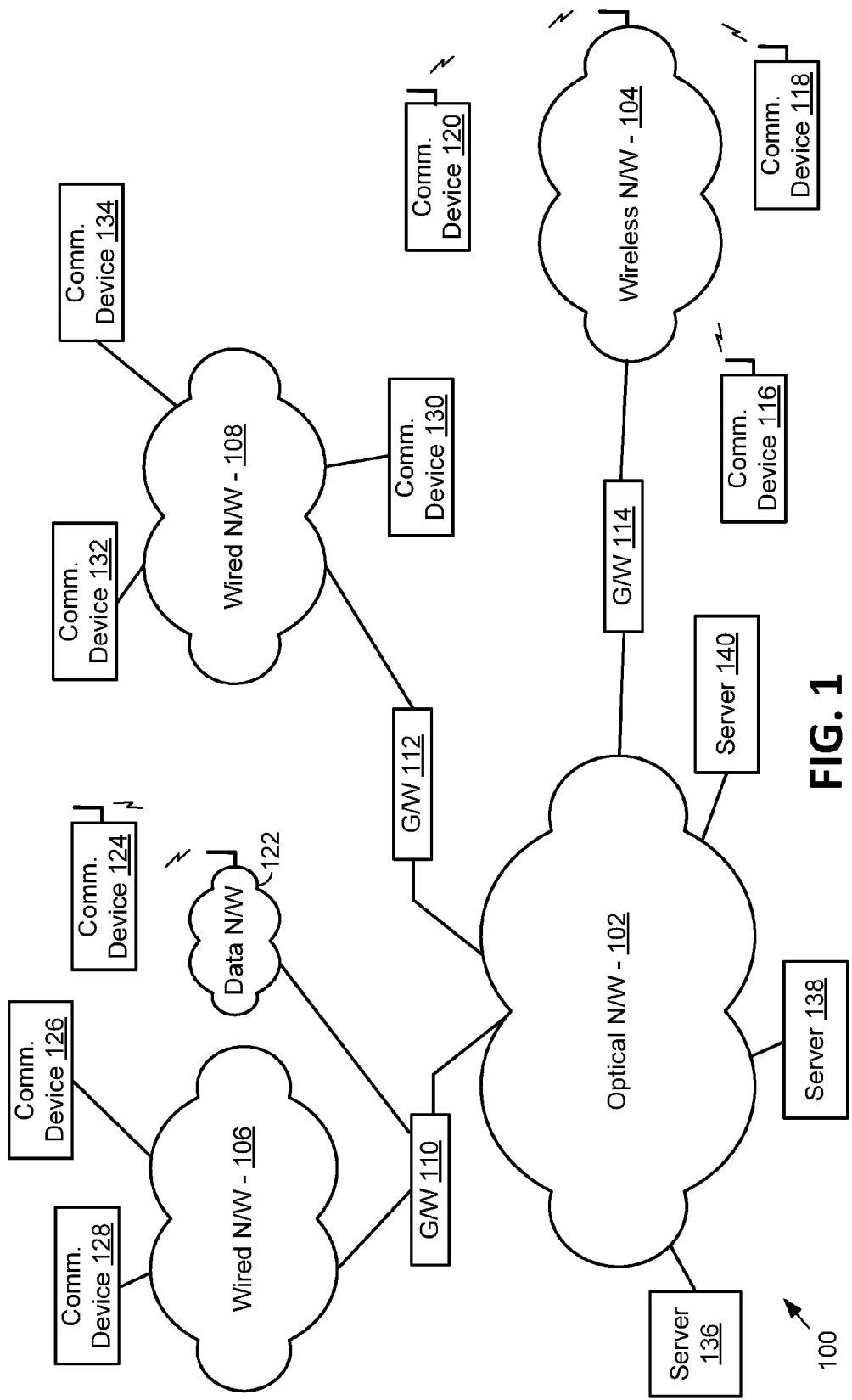
FIG. 1 is a system diagram illustrating a communication system having one or more communication devices constructed and operating according to one or more embodiments of the present disclosure.

FIG. 1 is a system diagram illustrating a communication system 100 having one or more communication devices constructed and operating according to one or more embodiments of the present disclosure. The communication system 100 includes a communication infrastructure that services a plurality of communication devices. The communication infrastructure includes an optical network 102, a wireless network 104, a wired network 106, and a wired network 108. These networks provide a backbone for servicing communications among a plurality of communication devices. The optical network 102 includes optical network components and may also include wired networking components. It operates according to one or more communication standards. Coupled to the optical network are servers 136, 138, and 140, which service various types of communications and/or transactions, e.g., media services, financial transactions, searching, and/or other commerce. Gateways bridge the networks 102, 104, 106 and 108. Gateway 114 bridges communications between optical network 102 and wireless network 104, gateway 110 bridges communications between optical network 102 and wired network 106, and gateway 112 bridges communications between optical network 102 and wired network 108.

Wireless network 104 may be a cellular network, a Wireless Wide Area Network (WWAN), a Wireless Local Area Network (WLAN), a Wireless Personal Area Network (WPAN), a Near Field Communication (NFC) network, a 60 GHz network, or a combination of these. The wireless network 104 supports one or more wireless communication protocols, e.g., IEEE 802.11x, GSM, EDGE, LTE, and/or other wireless communication protocols. The wireless network 104 supports communication devices 116, 118, and 120. These communication devices 116, 118, and 120 may be cell phones, laptop computers, desktop computers, tablet computers, data terminals, or other computing devices that support wireless communications and that may service wired communications.

Wired networks 106 and 108 may be Local Area Networks (LANs), Wide Area Networks (WANs), cable networks, other types of wired networks, and/or a combination of these. Wired network 106 supports standardize wired communications and services communication devices 126 and 128. Wired network 108 supports communication devices 130, 132 and 134. These communication devices 126, 128, 130, 132, and 134 may be computers, home entertainment components, televisions, home gateways, and/or other types of devices that support wired communications (and wireless communications). Wired networks 106 may also support a coupled wireless data network 122, such as a WLAN, a WWAN, a Near Field Communication network, a 60 GHz network, and/or another type of wireless network. The wireless data network 122 supports communication device 124.

One or more of the communication devices illustrated in FIG. 1 includes one or more Analog to Digital Converters (ADCs) constructed and/or operating according to the present disclosure. The ADCs of the present disclosure, described further herein, may be incorporated into communication devices 124, 126, 128, 130, 132, and 134 supported by wired networks 106 and 108, communication devices 116, 118, and 120 supported by wireless network 104, and/or servers 136, 138, and 140 supported by optical network 102. The ADCs of the present disclosure may be incorporated into components of one or more of optical network 102, wireless network 104, wired networks 106 and 108 and/or gateways 110, 112 and 114.

Figure 2:
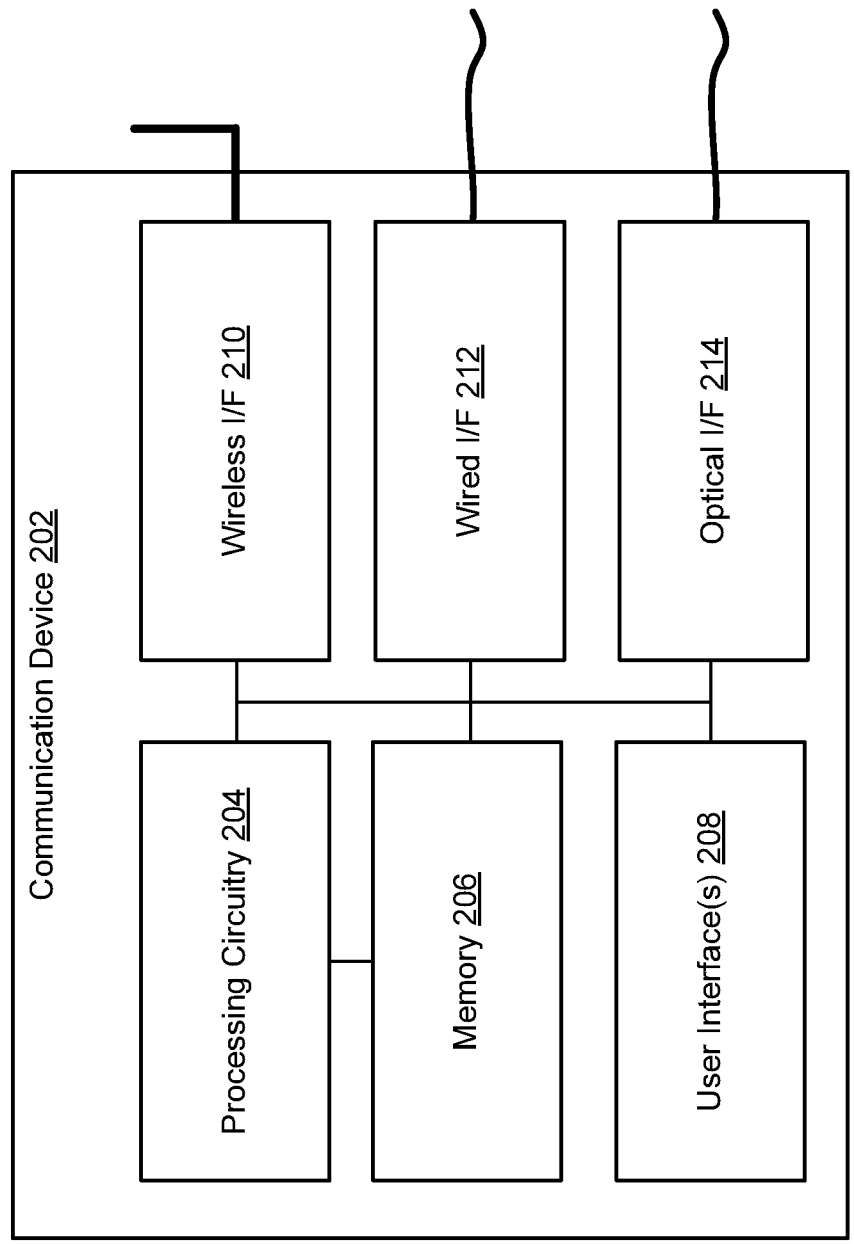
FIG. 2 is a block diagram illustrating components of a communication device constructed and operating according to one or more embodiments of the present disclosure.

FIG. 2 is a block diagram illustrating components of a communication device constructed and operating according to one or more embodiments of the present disclosure. The communication device 202 includes processing circuitry 204, memory 206, one or more user interfaces 208, a wireless interface 210, and one or more of a wired interface 212 and an optical interface 214. The communication device may be one of the communication devices illustrated in FIG. 1.

The processing circuitry 204 may be one or more of a microprocessor, a digital signal processor, application specific processing circuitry, and/or other circuitry capable of executing logic operations based upon pre-programmed instructions or the execution of software instructions. The memory 206 may be dynamic RAM, static RAM, flash RAM, ROM, programmable ROM, magnetic storage, optical storage or other storage that is capable of storing instructions and data. The stored data may be audio data, video data, user data, software instructions, configuration data, or other data. The user interface 208 supports one or more of a video monitor, a keyboard, an audio interface, or other user interface device.

The wireless interface 210 supports one or more of cellular communications, WLAN communications, WPAN communications, WWAN communications, 60 GHz communications, NFC communications, and/or other wireless communications. These wireless communications are standardized in most embodiments and proprietary in other embodiments. The wired interface 212 supports wired communications, which may be LAN communications, WAN communications, cable network communications, direct data link communications, or other wired communications. The optical interface 214 supports optical communications, which are standardized in some embodiments and proprietary in other embodiments.

Multiple of the components 204, 206, 208, 210, 212, and 214 of the communication device may be constructed on a single integrated circuit die. It is fairly common to form all communication components, e.g., wireless interface 210, wired interface 212, and optical interface 214 on a single integrated circuit. One or more of the wireless interface 210, the wired interface 212 and the optical interface 214 may include an ADC constructed according to and/or operating according to one or more embodiments of the present disclosure, which will be described further herein with reference to FIG. 3A through FIG. 8.

Figure 3A:
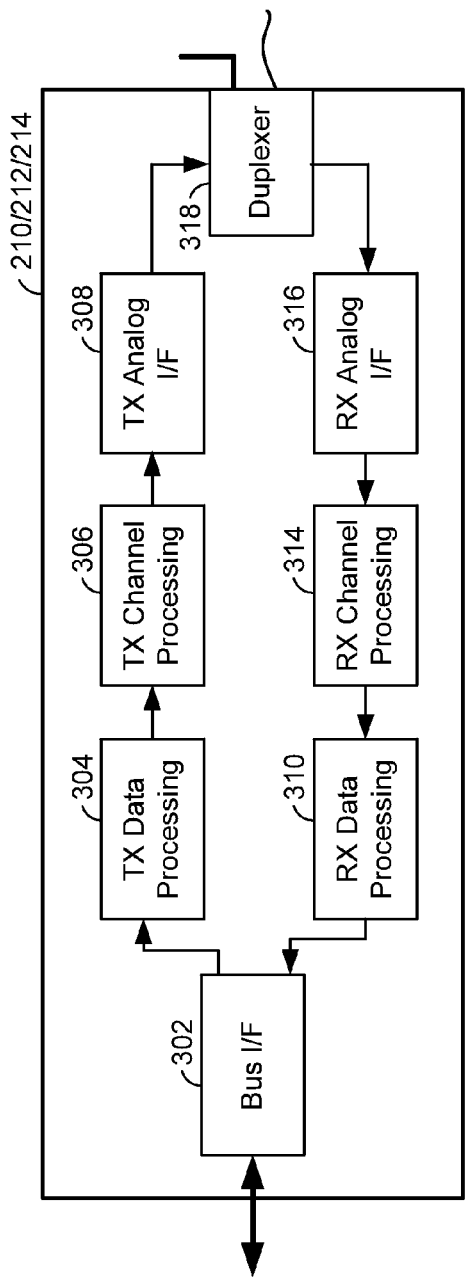
FIG. 3A is a block diagram illustrating a communication interface of a communication device constructed operating according to one or more embodiments of the present disclosure.

FIG. 3A is a block diagram illustrating a communication interface of a communication device constructed operating according to one or more embodiments of the present disclosure. The communication interface, which may be any of the wireless interface 210, the wired interface 212, or the optical interface 214 of FIG. 2, includes a bus interface 302 that interfaces with processing circuitry of the communication device. The communication interface includes a transmit path and a receive path. The transmit path includes TX data processing 304 that forms data for transmission. The TX data processing 304 may execute one or more protocol layer functions, e.g., Link and/or PHY layer operations, or a portion thereof. In other constructs the TX data processing 304 may service additional operations as well such as session, transport, and network layer operations. TX channel processing 306 performs PHY layer operations in forming data for transmission. The TX analog interface 308 transitions the data from digital to analog form. Duplexer 318 allows transmit and receive circuitry to interface with a coupled physical media. Receive path components include the duplexer 318, an RX analog interface 316, RX channel processing 314, RX data processing 310 and the bus interface 302. These components perform operations that are complementary to the transmit path operations.

The RX analog interface 316 includes an ADC constructed and operating according to the present disclosure. In other embodiments, the ADC could be included in other components of the communication interface as well. As will be described further with reference to FIGS. 4A-8, this ADC provides improved performance in converting signals, e.g., information signals, from an analog format to a digital format.

Figure 3B:
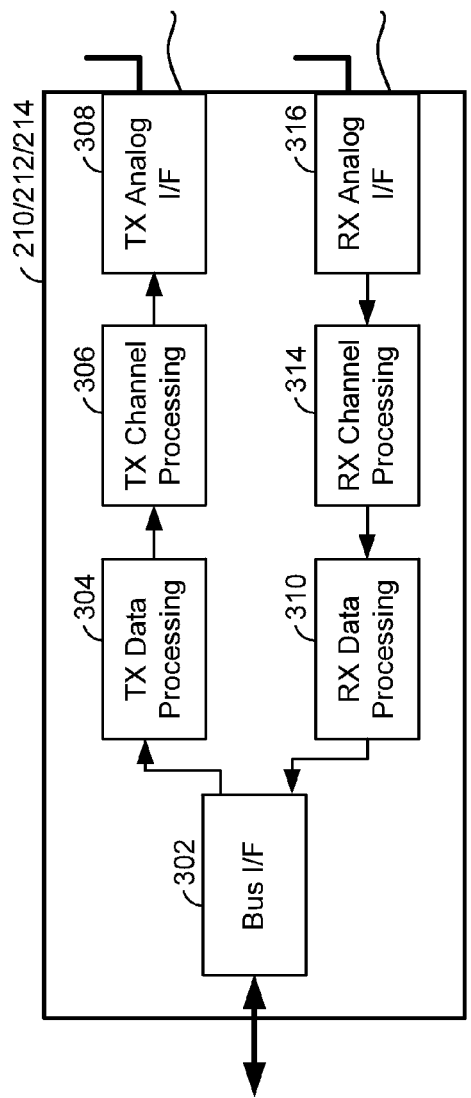
FIG. 3B is a block diagram illustrating a communication interface of a communication device constructed operating according to one or more embodiments of the present disclosure.

FIG. 3B is a block diagram illustrating a communication interface of a communication device constructed operating according to one or more embodiments of the present disclosure. The structure of FIG. 3B is same/similar to the structure of FIG. 3A, except that the TX analog interface 308 and the RX analog interface 316 couple directly to differing media and/or differing antennas.

Figure 4A:
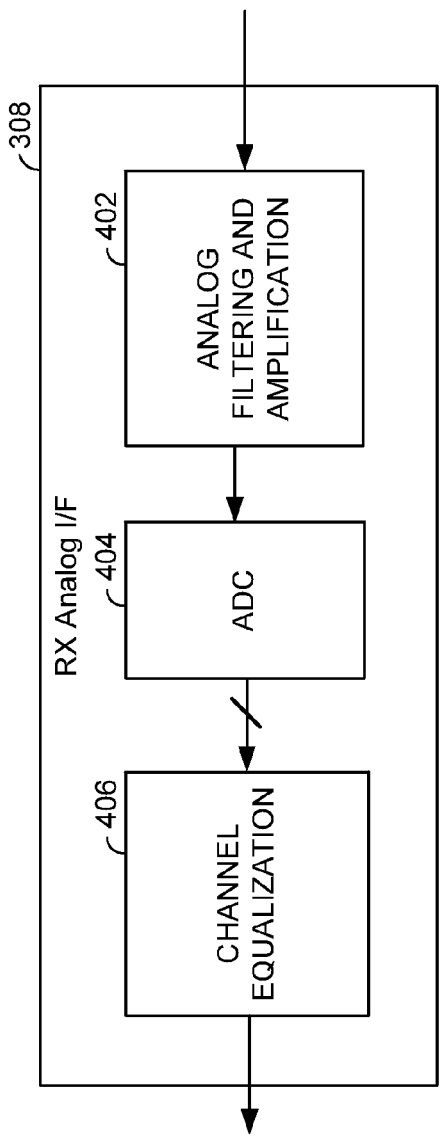
FIG. 4A is a block diagram illustrating an RX analog interface of a communication interface of a communication device constructed operating according to one or more embodiments of the present disclosure.

FIG. 4A is a block diagram illustrating an RX analog interface 316 of a communication interface of a communication device constructed operating according to one or more embodiments of the present disclosure. The RX analog interface 316 includes at least one component that performs analog filtering and amplification upon an incoming signal, which is an information signal in some embodiments. The information signal could be received via wired media, an antenna, or an optical interface, for example. After analog filtering and amplification is performed at block 402, an ADC 404 converts the signal from an analog format to a digital format. The structure and operation of an ADC according to one or more embodiments of the present disclosure will be described in more detail with reference to FIGS. 5-8. After conversion to a digital format, channel equalization (and, optionally, data extraction) via block 406 is performed on the digital signal. The equalized and extracted data is then passed to RX channel processing 314 of FIG. 3A (or 3B).

Figure 4B:
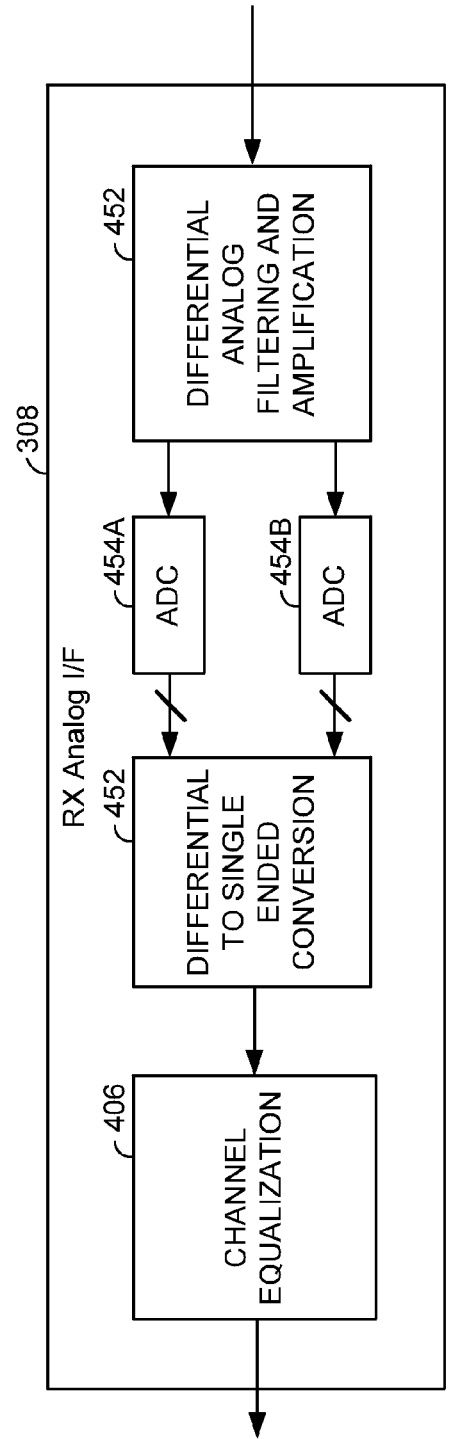
FIG. 4B is a block diagram illustrating an RX analog interface of a communication interface of a communication device constructed operating according to one or more embodiments of the present disclosure.

FIG. 4B is a block diagram illustrating an RX analog interface of a communication interface of a communication device constructed operating according to one or more embodiments of the present disclosure. The structure of FIG. 4B is similar/same to that of FIG. 4A except that the components of FIG. 4B operate on a differential signal, which may be a differential information signal. Differential analog filtering and amplification block 452 filters and amplifies an incoming differential analog signal. The output of the differential and amplification block 452 is a differential analog signal having positive and negative components. A first ADC 454A operates on the positive component of the differential analog signal to convert the positive component from an analog format to a digital format. A second ADC 454B operates on the negative component of the differential analog signal to convert the negative component from an analog format to a digital format. Differential to single ended conversion block 456 converts the digital format signal from a differential format to a single ended format.

Figure 5:
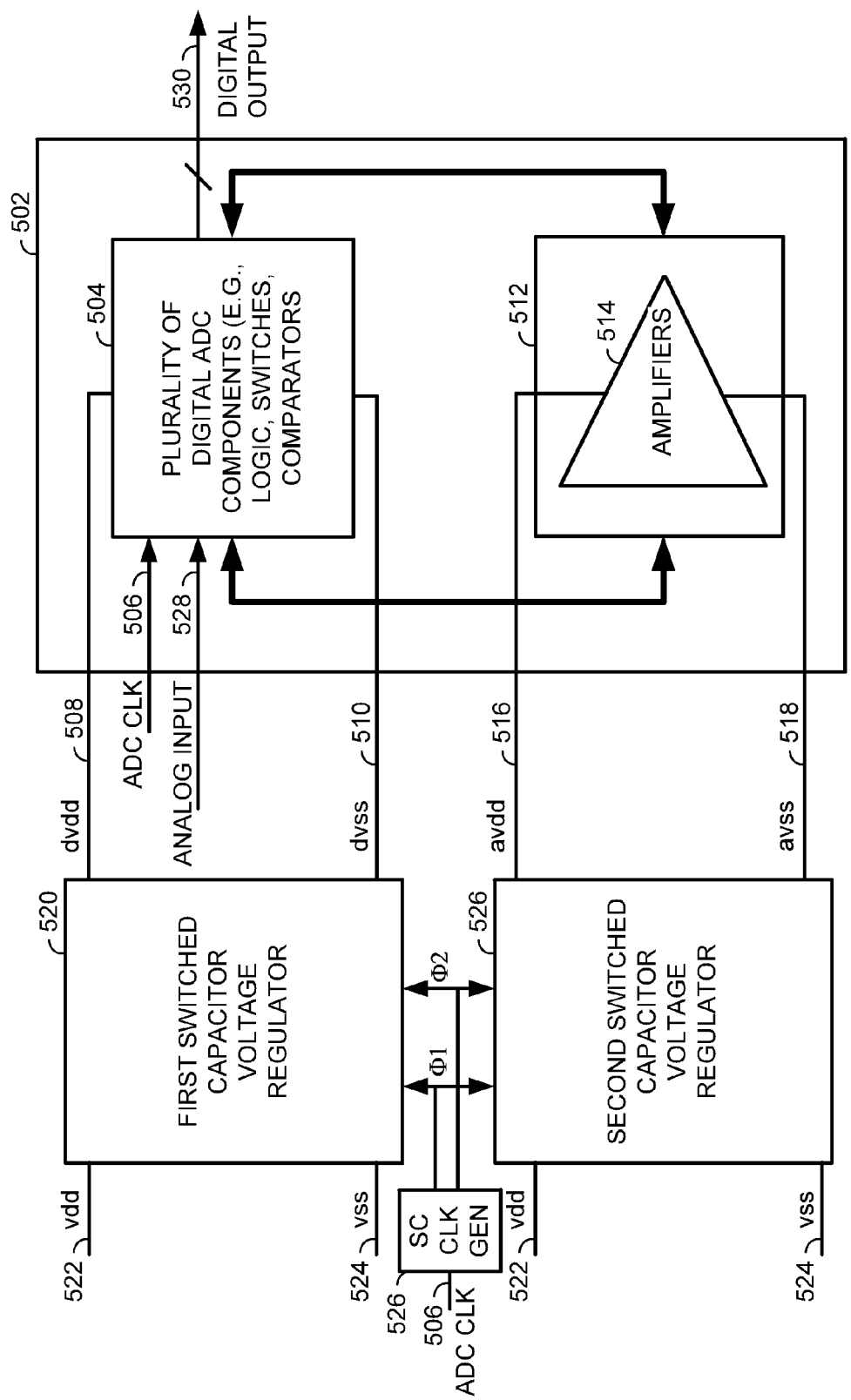
FIG. 5 is a block diagram illustrating an embodiment of an Analog to Digital Converter (ADC), which forms a portion of a communication interface of a communication device constructed and operating according to the present disclosure.

FIG. 5 is a block diagram illustrating an embodiment of an ADC, which forms a portion of a communication interface of a communication device constructed and operating according to the present disclosure. The ADC of FIG. 5 may be any of the ADCs 404, 454A, or 454B illustrated in FIGS. 4A and 4B. The ADC includes an ADC core 502, a first switched capacitor voltage regulator 520, and a second switched capacitor voltage regulator 526, which may be formed in a single integrated circuit.

The ADC core 502 includes a plurality of digital ADC components 504 configured to sample at least one incoming signal based on an ADC clock 506, a first voltage 508, and a first ground 510. The ADC core further includes a plurality of analog components 512 including at least one amplifier 514 configured to operate using a second voltage 516 and a second ground 518. The ADC core 502 may be one of any number of types of ADCs including but not limited to a direct-conversion or flash ADC, a successive-approximation ADC, a ramp-compare ADC, a Wilkinson ADC, an integrating ADC, a delta-encoded ADC, a pipeline ADC, a sigma-delta ADC, a time-interleaved ADC, or another type of ADC. In short, the ADC 502 receives an analog input 528 and converts the analog input 528 to a digital output 530. In embodiments described herein, the analog input 528 is an information signal in an analog format (single-ended or differential) within a communication device and the digital output 530 is an information signal in a digital format. In other embodiments, the analog input 528 may be a control signal, a sensor signal, or another analog signal that is to be converted to a digital format and the digital output 530 is a corresponding digital signal after conversion.

The interaction of the plurality of digital ADC components 504, which include one or more of logic circuits, switches and comparators, is shown generally to interface with the plurality of analog components 512. The structure of each of the plurality of digital ADC components 504 and the plurality of analog components 512 and their particular interconnectivity and interaction depends upon the type of ADC and its particular structure. The general interfacing and interaction of the plurality of digital ADC components 504 and plurality of analog components 512 of FIG. 5 is shown to illustrate how the first voltage 508, first ground 510, second voltage 516 and second ground 518 are generated and used by these components. Many various structures of an ADC are encompassed by the structure of FIG. 5, as one of ordinary skill in the art will appreciate.

A first switched capacitor voltage regulator 520 is configured to produce the first voltage 508 and the first ground 510 for the plurality of digital ADC components 504 using a supply voltage 522, a supply ground 524, and the ADC clock 506. A second switched capacitor voltage regulator 526 is configured to produce the second voltage 516 and the second ground 518 using the supply voltage 522, the supply ground 524, and the ADC clock 506. As shown, the ADC clock 506 is used by a switched capacitor clock generation circuit 526 to generate complementary and non-overlapping clocks $\Phi 1$ and $\Phi 2$. A frequency of the complementary and non-overlapping clocks $\Phi 1$ and $\Phi 2$ is based upon the ADC clock 506. In various embodiments, the frequency of the complementary and non-overlapping clocks $\Phi 1$ and $\Phi 2$ is one of being equal to the ADC clock 506, an integer multiple of the ADC clock 506, or a fraction of the ADC clock 506. For example, the frequency of the complementary and non-overlapping clocks $\Phi 1$ and $\Phi 2$ may be 2x, 3x, or Nx multiples of the ADC clock 506 or 1/2, 1/3, 1/4, 1/5, or 1/N (where N is an integer, for example) of the ADC clock 506. The frequency of the complementary and non-overlapping clocks $\Phi 1$ and $\Phi 2$ may change with a frequency change of the ADC clock 506 and also may change due to a change in its ratio to the ADC clock. Such changes may be at construction or during operation, depending upon the embodiment.

As will be further explained with reference to FIGS. 6 and 7, the first voltage 508, the first ground 510, the second voltage 516, and the second ground 518 are created by the first switched capacitor voltage regulator 520 and the second switched capacitor voltage regulator 526 based upon the complementary and non-overlapping clocks $\Phi 1$ and $\Phi 2$. The ADC clock 506 is used to sample the analog signal 528. Thus, by having a frequency of the complementary and non-overlapping clocks $\Phi 1$ and $\Phi 2$ based upon the ADC clock 506, noise in the first voltage 508, the first ground 510, the second voltage 516, and the second ground 518 will have frequency components consistent with the ADC clock 506, thus minimizing contributed noise during sampling.

In some embodiments, the first switched capacitor voltage regulator 520 uses analog feedback for voltage regulation while the second switched capacitor voltage regulator 526 uses digital feedback for voltage regulation. Particular embodiments of such voltage regulation will be further illustrated in FIGS. 6 and 7, respectively.

In some operations, the first switched capacitor voltage regulator 520 is configured to produce the first voltage 508 at a voltage greater than the supply voltage 522 and to produce the first ground 510 at a voltage less than the supply ground

524. Likewise, in some operations, the second switched capacitor voltage regulator 526 is configured to produce the second voltage 516 at a voltage greater than the supply voltage 522 and to produce the second ground 518 at a voltage less than the supply ground 524. By producing the first 508 and second 516 voltages and the first 510 and second 518 grounds with these extended ranges the ADC 404/454A/454B provide extended sampling range of the analog input 528 by the ADC 404/454A/454B. For example, the analog input 528 may have a voltage range that is greater than the supply voltage 522 or less than the supply ground 524. Prior structures would have required off-chip voltage regulators to service such extended signal range or would not have been able to service such extended signal range as contrasted to the extended sampling range of the ADC 404/454A/454B of the present disclosure. Further, by having these voltages at these extended ranges, amplification of signals within the ADC core 502 may have extended range.

In various operations and embodiments, voltage levels of the first and/or second voltage and the first and/or second ground are adapted based upon at least one of incoming signal amplitude, ADC clock frequency, process formation characteristics, supply voltage, supply ground, or operating temperature. For example, variation in a manufacturing process or the manufacturing process type may be used to determine at what level the voltages and grounds are produced. Further, an operating temperature of the integrated circuit in which the ADC 404/454A/454B is formed may dictate the levels at which the voltages and grounds are produced.

In still other embodiment(s), the first switched capacitor voltage regulator 520 and the second switched capacitor voltage regulator 526 may be combined into a single switched capacitor voltage regulator. In such embodiment(s), the switched capacitor voltage regulator may produce differing voltages and grounds for the ADC core 502 or may produce a single voltage and a single ground for the ADC core 502. In such case, the/these voltages may be greater than the supply voltage 522 and the/these grounds may be less than the supply ground 524.

Figure 6:
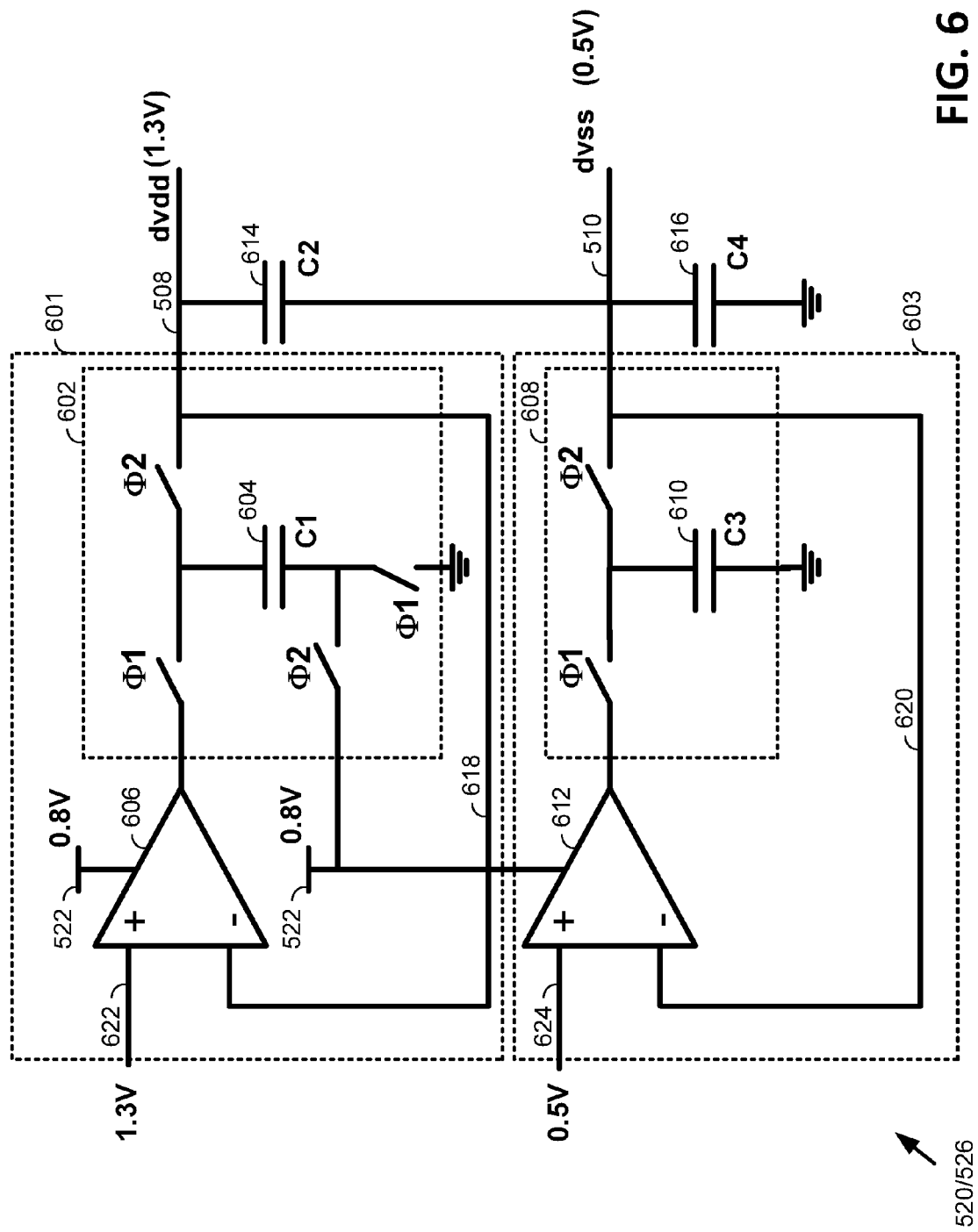
FIG. 6 is a circuit diagram illustrating a first switched capacitor voltage regulator according to the present disclosure.

FIG. 6 is a circuit diagram illustrating a switched capacitor voltage regulator 520/526 according to the present disclosure, which may be either the first switched capacitor voltage regulator 520 or the second switched capacitor voltage regulator 526. The switched capacitor voltage regulator 520/526 includes a first switched capacitor circuit 601 and a second switched capacitor circuit 603. The first switched capacitor circuit 601 includes a first plurality of switches 602 controlled by the complementary and non-overlapping clocks Φ1 and Φ2, a first capacitor 604, and first analog feedback. The first plurality of switches 602 may be transistors configured as switches or other suitable circuit elements that support switching functions. The first capacitor 604 is shown to be of non-variable capacitance. However, in other embodiments the first capacitor 604 may be of variable capacitance. The first analog feedback includes signal line 618 and operational amplifier 606. The first analog feedback couples the first voltage 508 to a negative input of the operational amplifier 606. The positive input to the operational amplifier 606 is a band gap reference voltage 622 at 1.3 volts and the output of the operational amplifier 606 couples to the first plurality of switches 602. The supply voltage 522 is at 0.8 volts.

The second switched capacitor circuit 603 includes a second plurality of switches 608 controlled by the complementary and non-overlapping clocks Φ1 and Φ2, a second capacitor 610, and second analog feedback. The second plurality of switches 608 may be transistors configured as switches or other suitable circuit elements that support switching functions. The second capacitor 610 is shown to be of non-variable capacitance. However, in other embodiments the second capacitor 610 may be of variable capacitance. The second analog feedback includes signal line 620 and operational amplifier 612. The second analog feedback couples the first ground 510 to a negative input of the operational amplifier 612. The positive input to the operational amplifier 612 is a band gap reference voltage 624 at 0.5 volts and the output of the operational amplifier 612 couples to the second plurality of switches 608.

Output capacitor 614 couples between the first voltage 508 and first ground 510 while output capacitor 616 couples between first ground 510 and the supply ground 524. With this configuration the first switched capacitor voltage regulator 520 provides sufficient power to the ADC core 502 to support its operations. While particular supply voltage 522, supply ground 524, first voltage 508, and first ground 510 voltage levels are provided, these voltages will differ from embodiment to embodiment.

Figure 7:
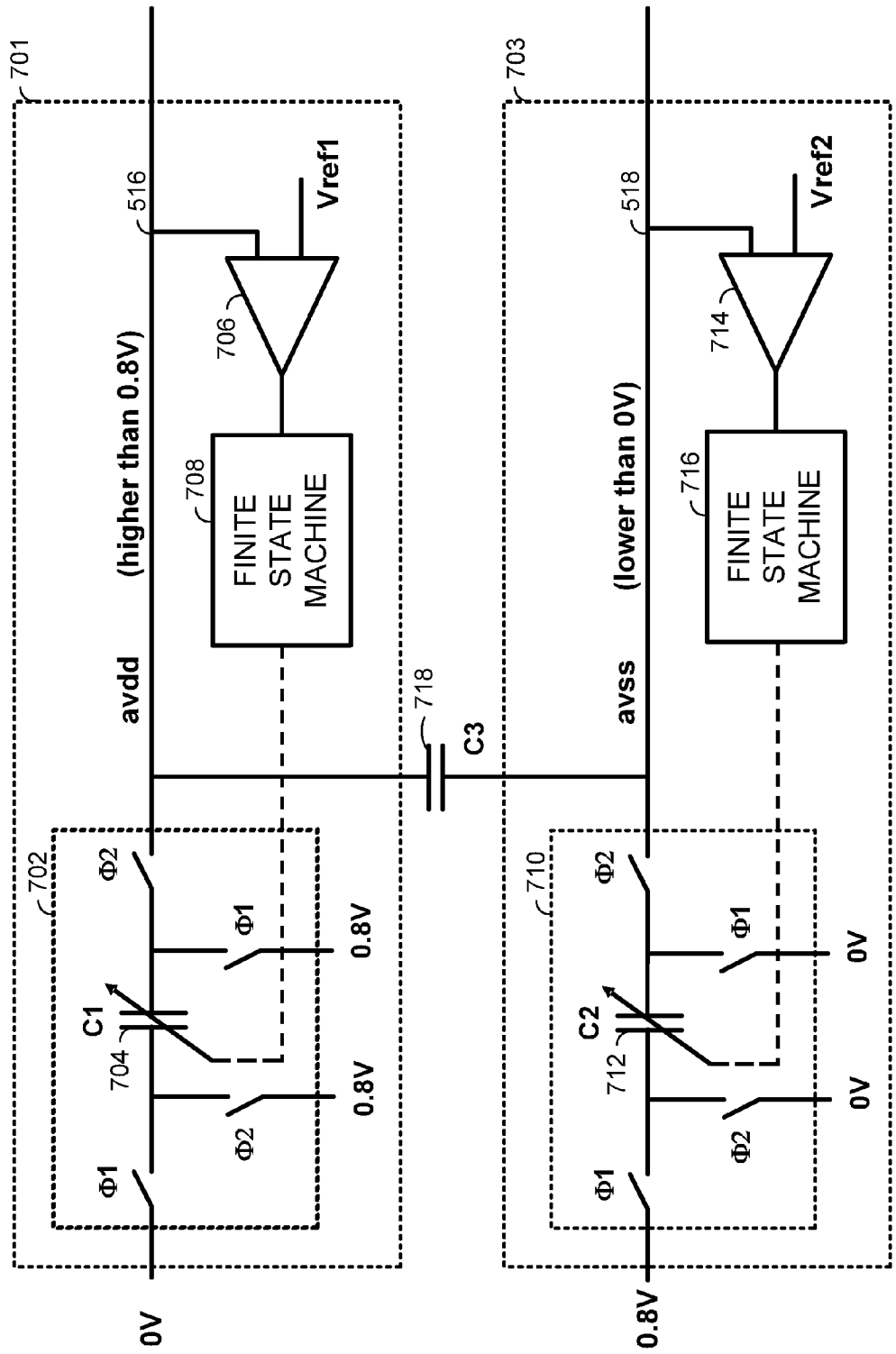
FIG. 7 is a circuit diagram illustrating a second switched capacitor voltage regulator according to the present disclosure.

FIG. 7 is a circuit diagram illustrating a switched capacitor voltage regulator 520/526 according to the present disclosure, which may be either the first switched capacitor voltage regulator 520 or the second switched capacitor voltage regulator 526. The switched capacitor voltage regulator 520/526 includes a first switched capacitor circuit 701 and a second switched capacitor circuit 703. The first switched capacitor circuit 701 includes a plurality of switches 702 controlled by the complementary and non-overlapping clocks Φ1 and Φ2, a first variable capacitor 704, and first digital feedback controlling the first variable capacitor 704 based upon the second voltage 516. The second switched capacitor circuit 703 includes a plurality of switches 710 controlled by the complementary and non-overlapping clocks Φ1 and Φ2, a second variable capacitor 712, and second digital feedback controlling the second variable capacitor 712 based upon the second ground 518. Each of the variable capacitors 704 and 712 may be a plurality of individual capacitors switched in and out by a plurality of switches, the state of which are controlled by the digital feedback to cause controlled variation of effective capacitance of the plurality of capacitors. Both of the first switched capacitor circuit 701 and the second switched capacitor circuit 703 are supplied by the supply voltage 522 at 0.8 volts and the supply ground 524.

The first digital feedback comprises a comparator 706 that receives as its input the second voltage 516 and a first band-gap reference voltage. The output of the comparator 706 is received by a first finite state machine 708, which is made up of a plurality of logic gates, a processor, or other circuitry and generates the control of the variable capacitor 704. The second digital feedback comprises a comparator 714 that receives as its input the second ground 518 and a second band-gap reference voltage. The output of the comparator 714 is received by a second finite state machine 716, which is made up of a plurality of logic gates, a processor, or other circuitry and generates the control of the variable capacitor 712.

Output capacitor 718 couples between the second voltage 516 and the second ground 518 to assist in providing stable voltages for the ADC. While particular supply voltage 522, supply ground 524, second voltage 516 and second ground 518 voltage levels are provided, these voltages will differ from embodiment to embodiment. Further, as indicated in FIG. 7, the second voltage 516 is greater than the supply voltage 522 of 0.8 volts while the second ground 518 is lower than the supply ground 524. Note that these values and their relative values may change from embodiment to embodiment and over time depending upon the particular requirements for the ADC.

FIG. 8 is a flow chart illustrating operation of an analog to digital converter according to one or more embodiments of the present disclosure. The method 800 includes generating a first voltage and a first ground using a first switched capacitor voltage regulator that operates using a supply voltage, a supply ground, and an ADC clock (Step 802). Structure for executing this operation is illustrated in FIG. 6. The method 800 continues with generating a second voltage and a second ground using a second switched capacitor voltage regulator that operates using the supply voltage, the supply ground, and the ADC clock (Step 804). Structure for executing this operation is illustrated in FIG. 7. The method 800 then includes sampling at least one incoming signal using a plurality of digital components that operate using the ADC clock, the first voltage, and the first ground (Step 806) and concludes with operating on at least the incoming analog signal using a plurality of analog components that operate using the second voltage and the second ground (Step 808). The operations of Step 808 may include operating not only on the incoming signal but on intermediate signals within the ADC.

The operation at Step 802 may include using analog feedback to generate the first voltage and the operation at Step 804 may include using digital feedback to generate the second voltage. With the operation 800 of FIG. 8, the second voltage may be generated at a voltage greater than the supply voltage and the second ground may be generated at a voltage less than the supply ground. Further, the operations 800 of FIG. 8 may include operating the first switched capacitor voltage regulator and the second switched capacitor voltage regulator using complementary and non-overlapping clocks with a frequency of the complementary and non-overlapping clocks based upon the ADC clock.

Figure 9:
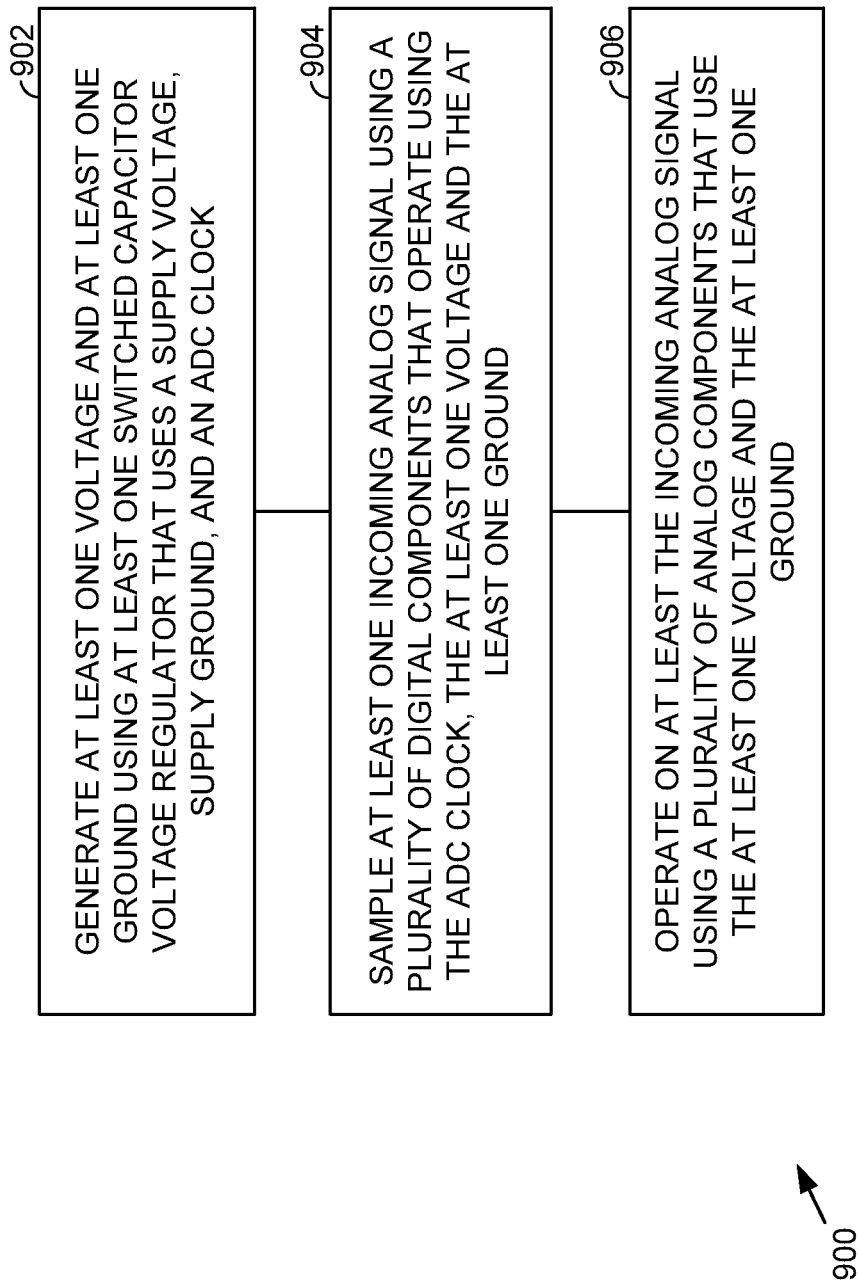
FIG. 9 is a flow chart illustrating operation of an analog to digital converter according to one or more embodiments of the present disclosure.

FIG. 9 is a flow chart illustrating operation of an analog to digital converter according to one or more embodiments of the present disclosure. The method 900 includes generating at least one voltage and at least one ground using at least one switched capacitor voltage regulator that operates using a supply voltage, a supply ground, and an ADC clock (Step 902). Structure for executing this operation is illustrated in one or more of FIGS. 5-7. The method 900 then includes sampling at least one incoming analog signal using a plurality of digital components that operate using the ADC clock, the at least one voltage and the at least one ground (Step 904). The method concludes with operating on at least the incoming signal using a plurality of analog components that operate using the at least one voltage and the at least one ground (Step 906). The operations of Step 906 may include operating not only on the incoming signal but on intermediate signals of the ADC.

The operations at Step 902 may include using analog feedback and/or digital feedback to generate the at least one voltage and the at least one ground. The at least one voltage may be generated at a voltage greater than the supply voltage and the at least one ground may be generated at a voltage less than the supply ground. Further, the operations 900 of FIG. 9 may include operating the at least one switched capacitor voltage regulator using complementary and non-overlapping clocks, with a frequency of the complementary and non-overlapping clocks based upon the ADC clock. Voltage levels of the at least one voltage and the at least one more ground may be adapted based upon at least one of incoming signal amplitude, ADC clock frequency, process formation characteristics, supply voltage, supply ground, or operating temperature.

The present disclosure has been described, at least in part, in terms of one or more embodiments. An embodiment of the present disclosure is used herein to illustrate the present disclosure, an aspect thereof, a feature thereof, a concept thereof, and/or an example thereof. A physical embodiment of an apparatus, an article of manufacture, a machine, and/or of a process that embodies the present disclosure may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

The present disclosure has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed disclosure. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. An Analog to Digital Converter (ADC) comprising:
    an ADC core comprising:
        a plurality of digital components configured to sample at least one incoming signal based on an ADC clock, a first voltage, and a first ground; and
        a plurality of analog components including at least one amplifier configured to operate using a second voltage and a second ground;
    a first switched capacitor voltage regulator configured to produce the first voltage and the first ground using a supply voltage, a supply ground, and the ADC clock; and
    a second switched capacitor voltage regulator configured to produce the second voltage and the second ground using the supply voltage, the supply ground, and the ADC clock.

2. The ADC of claim 1, wherein at least one of the first switched capacitor voltage regulator and the second switched capacitor voltage regulator comprises digital feedback.

3. The ADC of claim 1, wherein:
    the first switched capacitor voltage regulator is configured to produce the first voltage at a voltage greater than the supply voltage; and
    the first switched capacitor voltage regulator is configured to produce the first ground at a voltage less than the supply ground.

4. The ADC of claim 1, wherein:
    the second switched capacitor voltage regulator is configured to produce the second voltage at a voltage greater than the supply voltage; and the second switched capacitor voltage regulator is configured to produce the second ground at a voltage less than the supply ground.

5. The ADC of claim 1, wherein at least one of the first and the second switched capacitor voltage regulators comprises:
a first switched capacitor circuit comprising:
a first plurality of switches controlled by complementary and non-overlapping clocks;
a first variable capacitor; and
first digital feedback controlling the first variable capacitor; and
a second switched capacitor circuit comprising:
a second plurality of switches controlled by the complementary and non-overlapping clocks;
a second variable capacitor; and
second digital feedback controlling the second variable capacitor.

6. The ADC of claim 5, wherein a frequency of the complementary and non-overlapping clocks is one of:
equal to the ADC clock;
an integer multiple of the ADC clock; or
a fraction of the ADC clock.

7. The ADC of claim 5, wherein:
the first digital feedback comprises a first comparator and a first finite state machine; and
the second digital feedback comprises a second comparator and a second finite state machine.

8. An Analog to Digital Converter (ADC) comprising:
an ADC core comprising:
a plurality of digital components configured to sample at least one incoming signal based on an ADC clock, a first voltage and a first ground; and
a plurality of analog components including at least one amplifier configured to operate using a second voltage and a second ground; and
a switched capacitor voltage regulator configured to produce at least one of the first voltage and the second voltage and at least one of the first ground and the second ground using a supply voltage, a supply ground, and the ADC clock.

9. The ADC of claim 8, wherein the switched capacitor voltage regulator comprises analog feedback for production of the first voltage and the first ground.

10. The ADC of claim 8, wherein the switched capacitor voltage regulator comprises digital feedback for production of the first voltage and the first ground.

11. The ADC of claim 8, wherein the switched capacitor voltage regulator includes:
a first switched capacitor circuit comprising:
a first plurality of switches controlled by complementary and non-overlapping clocks;
a first capacitor; and
first analog feedback; and
a second switched capacitor circuit comprising:
a second plurality of switches controlled by the complementary and non-overlapping clocks;
a second capacitor; and
second analog feedback.

12. The ADC of claim 11, wherein a frequency of the complementary and non-overlapping clocks is one of:
equal to the ADC clock;
an integer multiple of the ADC clock; or
a fraction of the ADC clock.

13. The ADC of claim 11, wherein:
the first analog feedback comprises a first amplifier; and
the second analog feedback comprises a second amplifier.

14. The ADC of claim 8, wherein the switched capacitor voltage regulator includes:
a first switched capacitor circuit comprising:
a first plurality of switches controlled by complementary and non-overlapping clocks;
a first variable capacitor; and
first digital feedback controlling the first variable capacitor; and
a second switched capacitor circuit comprising:
a second plurality of switches controlled by the complementary and non-overlapping clocks;
a second variable capacitor; and
second digital feedback controlling the second variable capacitor.

15. The ADC of claim 8, wherein the switched capacitor voltage regulator is switched by a clock that is one of:
equal to the ADC clock;
an integer multiple of the ADC clock; or
a fraction of the ADC clock.

16. A method for operating an Analog to Digital Converter (ADC) comprising:
generating one or more voltages and one or more grounds using one or more switched capacitor voltage regulators that operate using a supply voltage, a supply ground, and an ADC clock;
sampling at least one incoming signal using a plurality of digital components that operate using the ADC clock, the one or more voltages, and the one or more grounds; and
operating on at least the incoming signal using a plurality of analog components that operate using the one or more voltages and the one or more grounds.

17. The method of claim 16, wherein generating the one or more voltages and the one or more grounds using one or more switched capacitor voltage regulators further comprises operating the one or more switched capacitor voltage regulators using at least one of analog feedback and digital feedback.

18. The method of claim 16, wherein:
the one or more of the voltages are generated at voltages greater than the supply voltage; and
the one or more of the grounds are generated at voltages less than the supply ground.

19. The method of claim 16 further comprising operating the switched capacitor voltage regulators using complementary and non-overlapping clocks that are based upon the ADC clock.

20. The method of claim 16, wherein voltage levels of the one or more voltages and the one or more grounds are adapted based upon at least one of incoming signal amplitude, ADC clock frequency, process formation characteristics, supply voltage, supply ground, or operating temperature.

* * * * *